(12) United States Patent
Erokhin et al.

(10) Patent No.: US 6,998,353 B2
(45) Date of Patent: *Feb. 14, 2006

(54) ACTIVE WAFER COOLING DURING DAMAGE ENGINEERING IMPLANT TO ENHANCE BURIED OXIDE FORMATION IN SIMOX WAFERS

(75) Inventors: Yuri Erokhin, Newburyport, MA (US); Julian G. Blake, Gloucester, MA (US)

(73) Assignee: Ibis Technology Corporation, Danvers, MA (US)

( * ) Notice: Subject to any disclaimer, the term of this patent is extended or adjusted under 35 U.S.C. 154(b) by 148 days.

This patent is subject to a terminal disclaimer.

(21) Appl. No.: 10/011,518

(22) Filed: Nov. 5, 2001

(65) Prior Publication Data

US 2003/0087504 A1 May 8, 2003

(51) Int. Cl.
*H01L 21/31* (2006.01)

(52) U.S. Cl. ............... 438/766; 438/423; 438/471; 438/966

(58) Field of Classification Search ............... 438/400, 438/222, 226, 311, 357, 363, 413, 540, 766, 438/787–789, 914, 423, 471, 966
See application file for complete search history.

(56) References Cited

U.S. PATENT DOCUMENTS

| | | | |
|---|---|---|---|
| 4,139,051 A | | 2/1979 | Jones et al. |
| 4,693,777 A | | 9/1987 | Hazano et al. |
| 4,786,608 A | * | 11/1988 | Griffith ............... 438/766 |
| 4,938,992 A | * | 7/1990 | Mears ............... 427/578 |
| 5,053,627 A | | 10/1991 | Ruffell et al. |
| 5,131,460 A | * | 7/1992 | Krueger ............... 165/80.2 |

(Continued)

FOREIGN PATENT DOCUMENTS

| | | |
|---|---|---|
| EP | 0 225 717 A1 | 6/1987 |
| EP | 0 607 043 B1 | 3/1996 |
| EP | 0 926 725 A2 | 6/1999 |

OTHER PUBLICATIONS

Ion Implantation—Science and Technology. Ed. Ziegler. Chapter 10: "Wafer Cooling and Wafer Charging in Ion Implantation" by M.E. Mack (Ion Implantation Technology Co. Yorktown, 1996).

"The Role of Implant Temperature in the Formation of Then Buried Oxide Layers," by White, et al.

*Primary Examiner*—Lynne A. Gurley
*Assistant Examiner*—Stanetta Isaac
(74) *Attorney, Agent, or Firm*—Thomas J. Engellenner; Reza Mollaaghababa; Nutter McClennen & Fish LLP (57) ABSTRACT

The present invention provides methods and system for forming a buried oxide layer (BOX) region in a semiconductor substrate, such as, a silicon wafer. In one aspect, in a method of the invention, an initial dose of oxygen ions is implanted in the substrate while maintaining the substrate temperature in a range of about 300° C. to 600° C. Subsequently, a second dose of oxygen ions is implanted in the substrate while actively cooling the substrate to maintain the substrate temperature in range of about 50° C. to 150° C. These ion implantation steps are followed by an annealing step in an oxygen containing atmosphere to form a continuous BOX region in the substrate. In one preferred embodiment, the initial ion implantation step is performed in a chamber that includes a device for heating the substrate while the second ion implantation step is performed in a separate chamber that is equipped with a device for actively cooling the substrate. The annealing step can be performed in a third chamber or in either of the first or second chambers.

17 Claims, 9 Drawing Sheets

U.S. PATENT DOCUMENTS

| | | |
|---|---|---|
| 5,244,820 A | 9/1993 | Kamata et al. |
| 5,822,172 A | 10/1998 | White |
| 6,043,166 A | 3/2000 | Roitman et al. |
| 6,141,203 A | 10/2000 | Sherman |
| 6,153,524 A * | 11/2000 | Henley et al. ............... 438/691 |
| 6,784,072 B2 * | 8/2004 | Fox et al. .................... 438/404 |
| 6,794,264 B2 * | 9/2004 | Dolan et al. ................. 438/407 |
| 2002/0123211 A1 * | 9/2002 | Dolan et al. ................. 438/480 |
| 2002/0173123 A1 * | 11/2002 | Fogel et al. ................. 438/480 |
| 2003/0036289 A1 * | 2/2003 | Kawamura et al. ......... 438/766 |
| 2004/0013886 A1 * | 1/2004 | Fox et al. .................... 428/446 |
| 2005/0003626 A1 * | 1/2005 | Fox et al. .................... 438/404 |
| 2005/0130394 A1 * | 6/2005 | Falster ......................... 438/480 |

\* cited by examiner

ACTIVE WAFER COOLING DURING DAMAGE ENGINEERING IMPLANT TO ENHANCE BURIED OXIDE FORMATION IN SIMOX WAFERS

BACKGROUND OF THE INVENTION

The present invention relates generally to methods and systems for generating a buried insulating layer in a semiconductor substrate. More particularly, the invention provides methods and systems for forming a buried oxide layer in a semiconductor substrate, such as, silicon.

One method known in the art as Separation by Implantation of Oxygen (SIMOX) forms a thin buried oxide (BOX) layer in a semiconductor substrate, such as silicon, by bombarding the substrate with energetic oxygen ions at a high dose. Typically, the substrate is heated to a temperature of about 400° C. to 600° C. during this implantation so that damage to crystal structure of the substrate is offset, in part, by "self-annealing." Following implantation, residual damage in the substrate is removed and buried oxide layer is formed by a further annealing step at an elevated temperature of about 800° C. or higher. The buried oxide layer can function as an insulating layer that separates an upper semiconductor layer from the bulk semiconductor. This allows formation of devices on the upper silicon layer with better performance characteristics, such as, enhanced speed and reduced power consumption. Devices formed on a silicon substrate having a buried oxide layer, known as silicon-on-insulator (SOI) devices, are routinely utilized in a number of technological applications.

A variety of modifications to the basic SIMOX process described above have been proposed in the art to enhance the efficiency of the formation of the buried oxide layer and its characteristics. In one such method, an initial implantation step is followed by a second implantation step, generally known as a touch-up or damage engineering implant, at a significantly lower oxygen dose. Wafer heating is often stopped during this touch-up process and energy of the ions can also be modified. The effect of the touch-up implant is to increase the damage to the layer in which the implanted oxygen ions are deposited and/or a layer in proximity thereof. The touch-up implant is then followed, for example, by a conventional annealing step to generate a single crystal surface layer of silicon and a continuous buried layer of silicon dioxide. The touch-up implant provides a number of advantages. For example, if the annealing is carried out in an oxygen-containing atmosphere, the touch-up implant can facilitate the reaction of oxygen atoms diffused to the damaged layer and increase layer efficiency for trapping diffused oxygen atoms during the annealing step, thereby enhancing the continuity and the growth of the buried oxide layer.

There is, however, still a need for providing improved SIMOX processes and systems that would allow a more efficient formation of the buried oxide layer, and further would enhance the characteristics of the buried oxide layer, such as, its thickness and its uniformity.

SUMMARY OF THE INVENTION

The present invention relates to methods and systems for forming a buried oxide layer (BOX) in a semiconductor substrate, such as, a silicon wafer, and more particularly, to methods and systems for an improved implementation of a touch-up implant in a SIMOX process. According to one aspect of the invention, subsequent to an initial implantation of a first dose of oxygen ions in a substrate, preferably performed while maintaining the substrate temperature in a range of about 300° C. to 600° C., a second dose of oxygen ions is implanted in the substrate, in a step herein referred to as touch-up implant, while actively cooling the substrate to maintain its temperature below approximately 150° C., and more preferably, in a range of about 50° C. to about 150° C. The substrate is then annealed in an oxygen-containing atmosphere to generate a buried layer of silicon oxide. The term "active cooling", as used herein, refers to removing heat from a substrate, e.g., a silicon wafer, by providing a thermal path between the substrate and a heat sink, held at a defined temperature, such that the substrate temperature is maintained at a value in a selected range.

The present invention differs from prior approaches that have utilized touch-up implants in that active cooling ensures that the substrate temperature during the touch-up implant is maintained within a preferred temperature range. Prior art systems merely turned off heaters to lower the substrate temperature. A major disadvantage of such passive cooling has been the limited degree of cooling that such approaches afford. The implantation process, itself, inherently results in wafer heating and, even without auxiliary heaters, the wafer temperature elevates to about 250° C. to 300° C. or more throughout prior-art touch-up procedures.

In a related aspects, the first ion implantation step is performed in a first chamber that is equipped with a device for heating the substrate to a temperature in a range of about 300° C. to about 600° C. while the touch-up implant is performed in a second chamber that includes a cooling device thermally coupled to the substrate in order to actively maintain the substrate temperature below approximately 150° C., and more preferably, in a range of about 50° C. to about 150° C. The annealing of the substrate, subsequent to the two implantation steps, is performed in a third chamber.

In further aspects of the invention, the first dose of the implanted oxygen is selected to be in a range of approximately $10^{16}$ to about $10^{18}$ ions/cm$^2$. Further, the second dose of oxygen, i.e., the oxygen dose utilized in the touch-up implant, can be in a range of about $1 \times 10^{13}$ to about $5 \times 10^{15}$ ions/cm$^2$. The initial ion implantation and the implantation during the touch-up implant can be accomplished by bombarding the substrate with a beam of oxygen ions having an energy in a range of about 30 keV to about 500 keV, and more preferably, in a range of about 150 keV to about 250 keV.

The annealing of the substrate, subsequent to the two implantation steps, can be performed in a temperature range of about 800° C. to about 1400° C. for a time period in a range of a few hours, e.g., 1 hour to 30 hours. Further, the concentration of oxygen in the annealing atmosphere can be in a range of about 1% to about 100%.

A method according to the teachings of invention can be utilized to form a buried oxide layer in a variety of semiconductor substrates. Such semiconductor substrates can include, but are not limited to, silicon (Si), germanium (Ge), Si/Ge alloys, or any 4-4, 3-5, or 2-6 binary or ternary compounds.

The methods of the invention can also be utilized to implant other ions, such as, nitrogen, silicon, germanium, inert gases, such as argon, or ionic species of water, in a substrate to generate buried insulating layers. Such substrates can include, for example, silicon, germanium, or gallium arsenide.

In another aspect, the substrate is conductively cooled during the touch-up implant to maintain its temperature in a range of about 50 to 150° C. Such a conductive cooling of the substrate can be accomplished, for example, by providing a conductive thermal path between the substrate and a heat sink, maintained at a selected temperature, to facilitate transfer of heat from the substrate to the heat sink. The conductive thermal path can be provided, for example, by a gas, such as helium, or by an elastomer, such as, a silicone resin.

The invention provides, in further aspects, a system for implementing a method of forming a buried oxide layer in a semiconductor substrate as described above. A system of the invention can include a first ion implantation chamber that can be utilized to implant a first dose of oxygen ions in the substrate. The first chamber can further include a heating device, such as, a halogen lamp, that maintains the substrate temperature in a range of about 300° C. to about 600° C. during ion implantation. The system can further include a second chamber that can be utilized to implant a second dose of oxygen ions in the substrate. The second chamber includes a cooling device, coupled to the substrate, that can maintain the substrate temperature during ion implantation below approximately 150° C., and more preferably, in a range of about 50° C. to about 150° C. In addition, the system can include a third chamber for annealing the substrate implanted with ions in the first and second chambers. The third chamber preferably includes a heating device that maintains the substrate temperature in a range of about 800° C. to about 1400° C. during annealing step.

In another aspect, the cooling device in the second chamber conductively cools the substrate by providing a conductive thermal path between the substrate and a heat sink, e.g., a substrate holder cooled to a defined temperature. The conductive thermal path can be provided, for example, by a gas, such as helium, nitrogen, oxygen, or argon, disposed between at least a portion of the substrate and the heat sink. Alternatively, an elastomer, such as, a silicone resin can provide such a conductive thermal path.

In another aspect, each of the first and second chambers includes an apparatus for generating ions with energies in a selected range, e.g., 30 to 500 keV, and for directing the ions onto the substrate surface, to effect implantation of the ions at a selected depth below the substrate surface.

The invention will be further described below with reference to the following drawings.

DETAILED DESCRIPTION

The present invention provides methods and systems for forming a buried oxide (BOX) region in a semiconductor substrate, such as, silicon, by implanting oxygen ions in the substrate in at least two distinct steps, performed at two different temperature regimes, followed by an annealing step at an elevated temperature in an oxygen containing atmosphere. In the first implantation step, a dose of oxygen ions in a range of about $10^{16}$ to about $10^{18}$ ions/cm$^2$ is implanted in the substrate. In the second implantation step, another dose of oxygen ions, for example, in a range of about $10^{13}$ to about $5 \times 10^{15}$ ions/cm$^2$, is implanted in the substrate while the substrate temperature is actively maintained in a range of approximately 50 to 150° C. Subsequently, an annealing step in an oxygen-containing atmosphere is performed to generate a continuous BOX region.

Although in the exemplary embodiments described below the semiconductor substrate is selected to be silicon, a method according to the teachings of the invention can be utilized to form BOX regions in other semiconductor substrates. Other examples of such substrates include, but are not limited to, germanium (Ge), Si/Ge alloys, and other 4-4, 3-5, 2-6 binary or ternary compounds.

Figure 1:
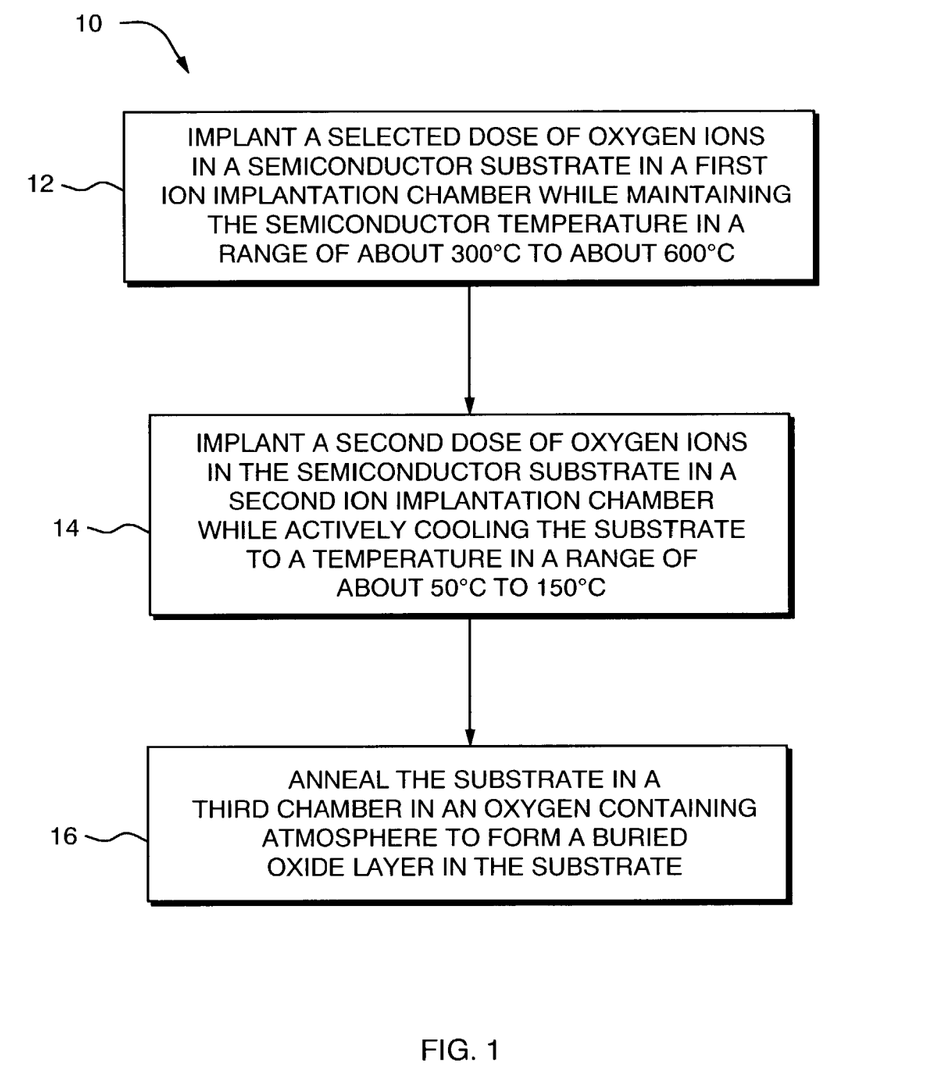
FIG. 1 is flow chart depicting various method steps according to the invention for forming a buried oxide layer in a semiconductor substrate, FIG. 2A schematically depicts a semiconductor substrate in which oxygen ions are implanted to form a damaged buried precursor layer, FIG. 2B schematically depicts the formation of a damaged, and possibly amorphous layer, by a touch-up implant step according to the teachings of the invention in the proximity of the damaged layer of FIG. 2A.

With reference to a flow chart 10 of FIG. 1, a method of the invention, in step 12, implants a dose of oxygen ions in a semiconductor substrate, e.g., silicon, in a first implantation chamber while maintaining the substrate temperature in a range of about 300 to 600° C. The ion implantation can be achieved, for example, by bombarding the substrate with a beam of oxygen ions having an energy in a range of about 30 to about 500 keV, and more preferably, in a range of about 150 to about 250 keV. In some embodiments, the energy of the ions bombarding the substrate is selected such that the ions penetrate the substrate and are deposited substantially at a depth in a range of about 3000 angstroms (A) to 4500 angstroms below the substrate surface. Further, the implanted ion dose in this initial implantation step can be in a range of about $10^{16}$ to about $10^{18}$ ions/cm$^2$. Moreover, the ion beam can be electrostatically, or magnetically, scanned over the irradiated portion of the substrate to generate a substantially uniform irradiation of the wafer.

Figure 2A:
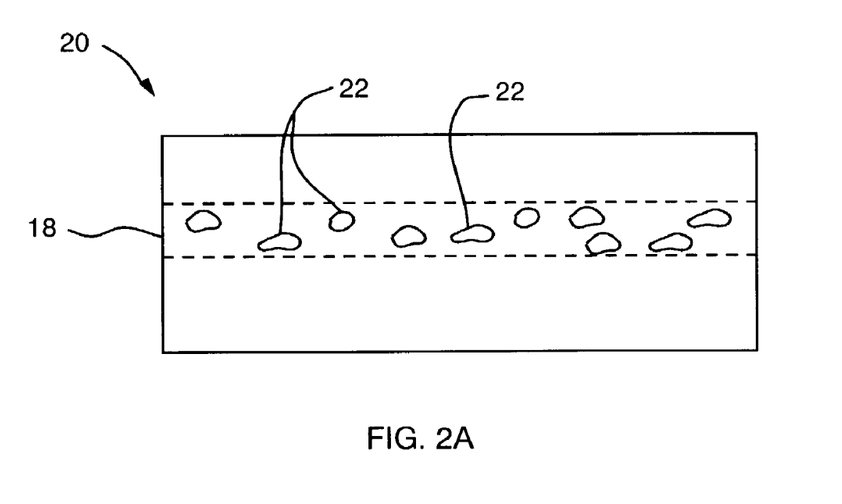

With reference to FIG. 2A, the initial ion implantation step 12 is understood to generate a buried damaged precursor layer 18 in a semiconductor substrate 20 below the semiconductor surface. The damaged layer 18 can contain a number of precipates 22 of SiOx in the form of a plurality of individual islands scattered throughout the damaged layer 18. The implantation of ions into the wafer can also cause damage to the upper silicon layer. Such damage to the upper silicon layer can adversely affect the properties of devices to be formed on the upper silicon layer. Accordingly, as mentioned above, the substrate is preferably maintained at an elevated temperature, e.g., in a range of about 300° C. to about 600° C., during the initial implantation step to effect dynamic annealing of the damage caused to the upper silicon layer by the implanted ions.

Referring again to the flow chart 10 of FIG. 1, subsequent to the initial implantation step 12, in step 14, another dose of oxygen ions is implanted in the substrate while actively maintaining the substrate temperature below approximately 150° C., and more preferably, in a range of about 50° C. to about 150° C. Similar to the step 10, in a preferred embodiment of the invention, the oxygen ion implantation in the step 12, herein referred to as "touch up" implant, can be accomplished by directing a beam of oxygen ions onto the substrate surface. The energy of the ion beam can be, for example, in a range of about 30 keV to about 500 keV. In some embodiments, the energy of the ion beam utilized for touch-up implant is selected such that the ions are substantially deposited at a depth in a range of about 3000 to 4500 angstroms below the substrate surface. Further, the implanted oxygen dose in the implantation step 14 can be in a range of about $10^{13}$ to about $5 \times 10^{15}$ ions/cm$^2$.

Figure 2B:
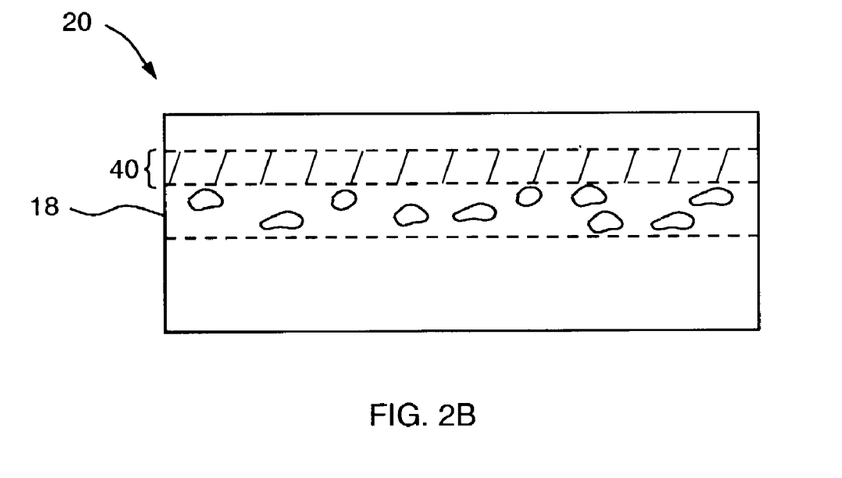

With reference to FIG. 2B, the touch-up implant step 14 is understood to further damage the precursor layer 18 and/or create a buried damaged, and possibly amorphous, layer 40 in proximity of the buried precursor layer formed in the initial implantation step 12. During the subsequent annealing step performed in an oxygen containing atmosphere, as described in more detail below, a highly defective region containing, for example, Si polycrystals, microtwins and stacking faults are formed in the damaged/amorphous layer 40. This defective layer is understood to enhance reaction between oxygen atoms diffused from the wafer surface into the precursor layer 18 during the oxidizing anneal step and native (silicon) atoms in the precursor layer 18 to form a continuous buried oxide layer.

Figure 3:
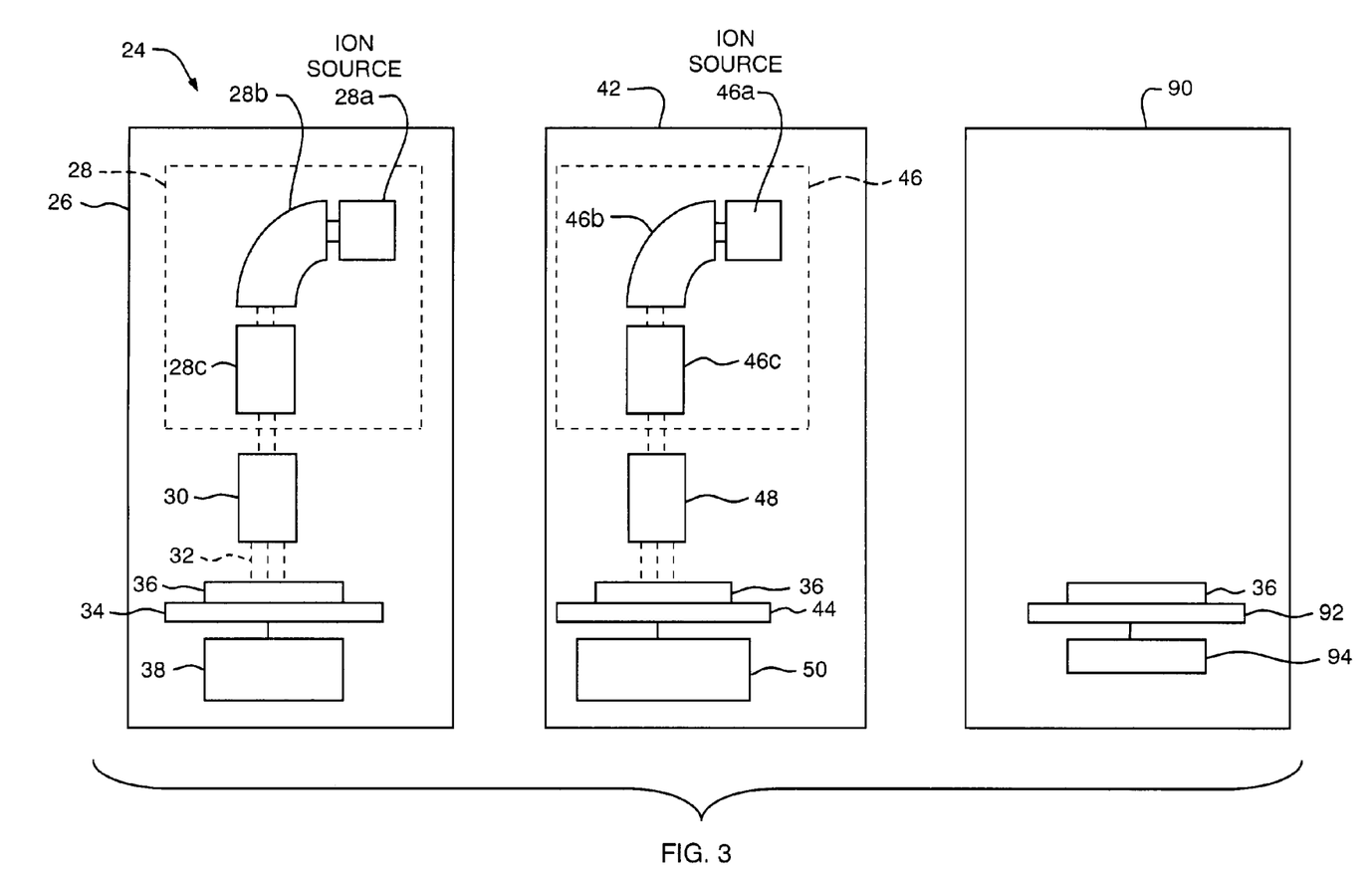
FIG. 3 is a schematic diagram of a system according to the teachings of the invention having three chambers, two of which are utilized for ion implantation in a substrate, and a third chamber that is utilized for annealing the substrate, FIG. 4 schematically illustrates a technique for conductively cooling a substrate during a touch-up implantation step in one embodiment of the invention, FIG. 5 schematically illustrates a device for actively cooling a substrate, FIG. 6 schematically illustrates another device for actively cooling a substrate, FIG. 7 schematically illustrates still another device for actively cooling a substrate that includes an electrostatic chuck for holding the substrate against a cooled platen.

With reference to FIG. 3, the implantation step 12 can be performed in an implantation chamber 26 of an ion implantation system 24 of the invention for forming a buried oxide layer in a semiconductor substrate. The implantation chamber 26 includes a beam delivery assembly 28 and a beam-forming device 30. The beam delivery assembly 28 can include an ion source 28a that generates a beam of oxygen ions. The beam delivery assembly 28 can further include an ion analyzer 28b, such as, a magnetic analyzer, that selects appropriately charged ions. An accelerator 28c accelerates those ions to a desired energy, e.g., about 200 keV, and the beam-forming device 30 shapes the accelerated ions into an ion beam 32. The exemplary implantation chamber 26 also includes a holder 34 that can be utilized to place a substrate 36, such as, a silicon wafer, in a path of the ion beam 32.

The beam forming device 30, which shapes the accelerated ions into a desired beam shape, can employ electrostatic or magnetic lenses, or can utilize time-varying electric and/or magnetic fields to raster the beam back and forth over the semiconductor substrate 36 to provide a substantially uniform irradiation of the substrate.

The implantation chamber 26 can also include a device 38, coupled to the holder 34, that actively maintains the substrate temperature in a defined range during ion implantation, e.g., in a range of approximately 500 to 600° C. In some embodiments, the device 38 can be, for example, a resistive heater. Alternatively, a plurality of halogen lamps can be utilized to heat the substrate to a desired temperature.

Further details regarding an ion implantation system, such as the system employed in chamber 26, can be found in U.S. Pat. No. 5,053,627 herein incorporated by reference. A variety of ion implanters known in the art can be utilized in the chamber 26 to perform the initial ion implantation step 12. For example, an ion implanter manufactured by Ibis Technology Corporation of Danvers, Mass., under the trade designation IBIS 1000 Production implanter can be employed in the chamber 26 to effect the ion implantation step 12.

Alternatively, the heating of the substrate during the initial implantation step 12 can be accomplished as a result of the bombardment of the substrate surface by an ion beam without utilizing a heating device, such as the device 38. That is, even in the absence of active heating of the substrate, the kinetic energy of the ions incident on the substrate is converted to heat that raises the substrate temperature, for example, to a few hundred degrees C.

With reference to both FIG. 1 and FIG. 3, the touch-up implant step 14 described above can be performed by removing the substrate, subsequent to the initial implantation step 12, from the chamber 26, and placing it in another chamber 42 of the ion implantation system 24. Similar to the chamber 26, the chamber 42 includes a holder 44 for holding the substrate 36, and further includes a beam delivery assembly 46 and a beam-forming device 48. Moreover, the beam delivery assembly 46 includes an ion source 46a, an analyzer 46b, and an accelerator 46c that in combination provide an ion beam having an energy in a defined range, e.g., 30 keV to 500 keV. Further, similar to the beam-forming device 30 of the chamber 26, the beam-forming device 48 shapes the ions into a desired beam shape.

In addition, the ion implantation chamber 42 includes a device 50 that can actively cool the substrate 36 during ion implantation to maintain its temperature in a range of about 50 to 150° C.

Figure 4:
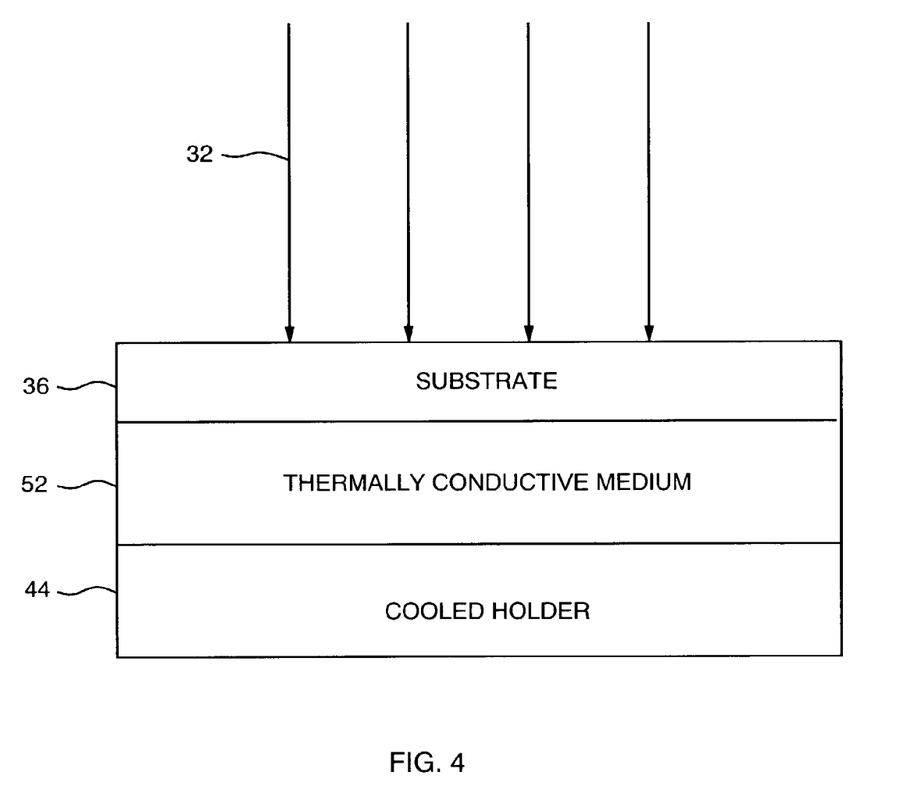

A variety of devices and techniques known in the art can be employed to cool the substrate 36 and maintain its temperature in a desired range. For example, with reference to FIG. 4, in one class of techniques for actively cooling a substrate during ion implantation, generally known as conductive cooling, a substrate, e.g., the silicon wafer 36, is in thermal contact with a cooled holder, such as, the holder 44 via a thermally conductive medium 52 while the substrate is exposed to an ion beam 32. The thermally conductive medium 52 can be, for example, a gas, such as, helium, hydrogen, nitrogen, argon or oxygen. Alternatively, the conductive medium can be an elastomeric material, as described in more detail below. The holder 44, which is typically made of metal, can be cooled, for example, by water circulating therethrough, to a desired temperature to function as a heat sink for removing heat from the substrate through thermal conduction via the thermally conductive medium 52.

Figure 5:
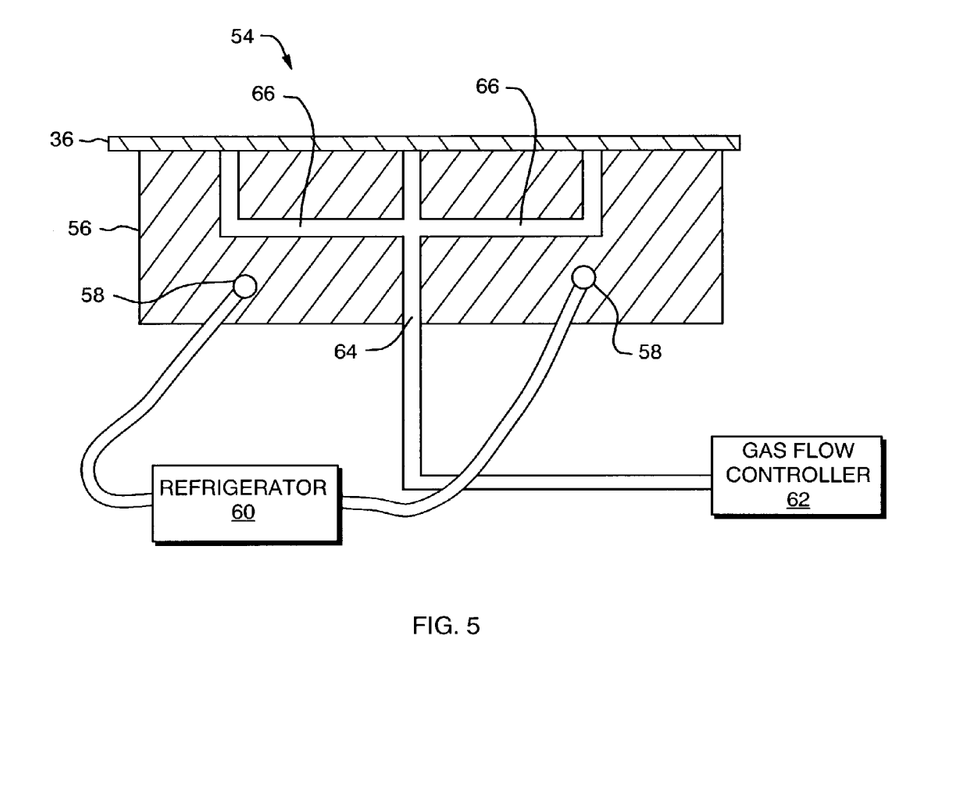

FIG. 5 illustrates a cooling device 54 known in the art that can be utilized in the chamber 42 of the exemplary ion implantation system 24 (FIG. 3) to provide active cooling of a substrate during the touch-up implant. The device 54 includes a platen 56 on which a substrate, such as, a silicon wafer 36, is disposed. A channel 58, formed in the platen 56, allows the passage of a fluid, e.g., water, therethrough. A refrigerator unit 60, which circulates the fluid through the channel 58, cools the fluid to a desired temperature. The cooled fluid in turn removes heat from the platen 56, thereby cooling it to a selected temperature.

A gas flow controller 62 introduces a gas, e.g., helium, into a conduit 64 that feeds the gas directly, or through a circular groove 66, into an interface between the semiconductor wafer 36 and the top surface of the platen 56. The gas introduced between the wafer and the top surface of the platen advantageously facilitates thermal contact between the wafer and the cooled platen, thereby enhancing the rate of heat transfer from the wafer to the platen. Further details regarding a wafer-cooling device, such as the device 54, can be obtained from U.S. Pat. No. 5,822,172, herein incorporated by reference.

Figure 6:
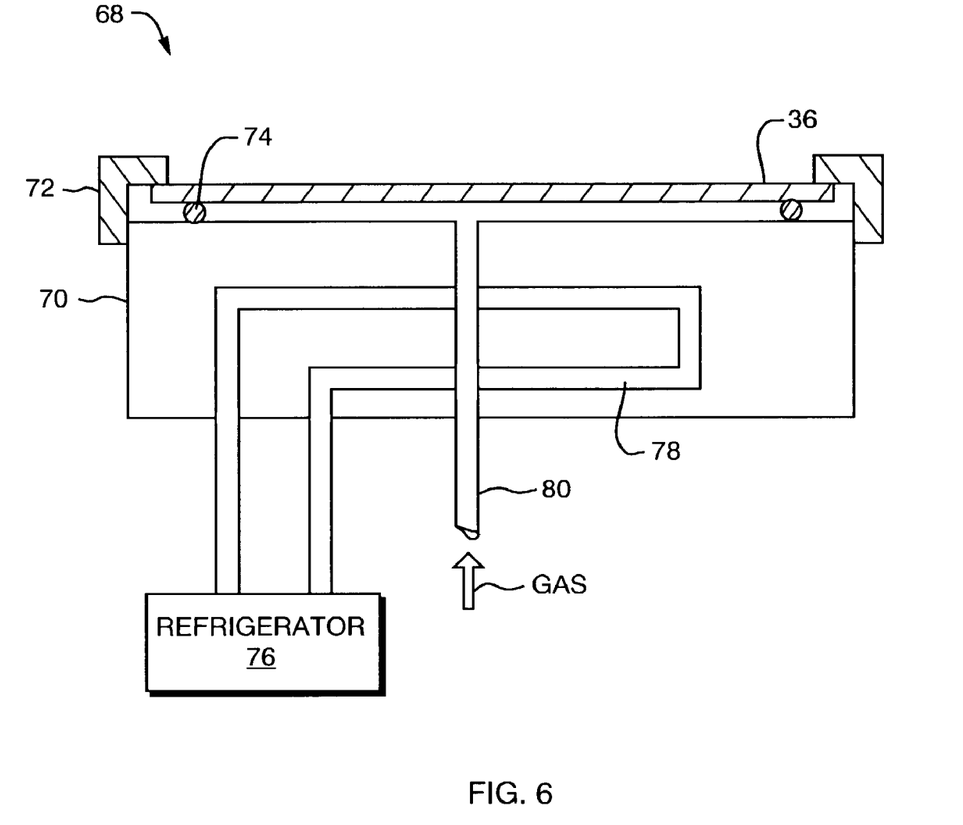

FIG. 6 illustrates another cooling device 68 suitable for use in an ion implantation system of the invention for actively cooling a semiconductor substrate during the touch-up implant. The exemplary device 68 includes a stage 70 on which a wafer 36 is held by a clamp 72. An O-ring 74 seals the wafer 36 against the top surface of the stage 70. A refrigerator 76 effects the circulation of a refrigerant, such as, ethylene glycol, through a conduit 78, formed in the stage 70, to cool it to a desired temperature. Further, a conduit 80 allows the introduction of a gas, such as, helium, into the space between the wafer 36 and the stage 70 to enhance heat conduction between the wafer and the cooled stage.

Figure 7:
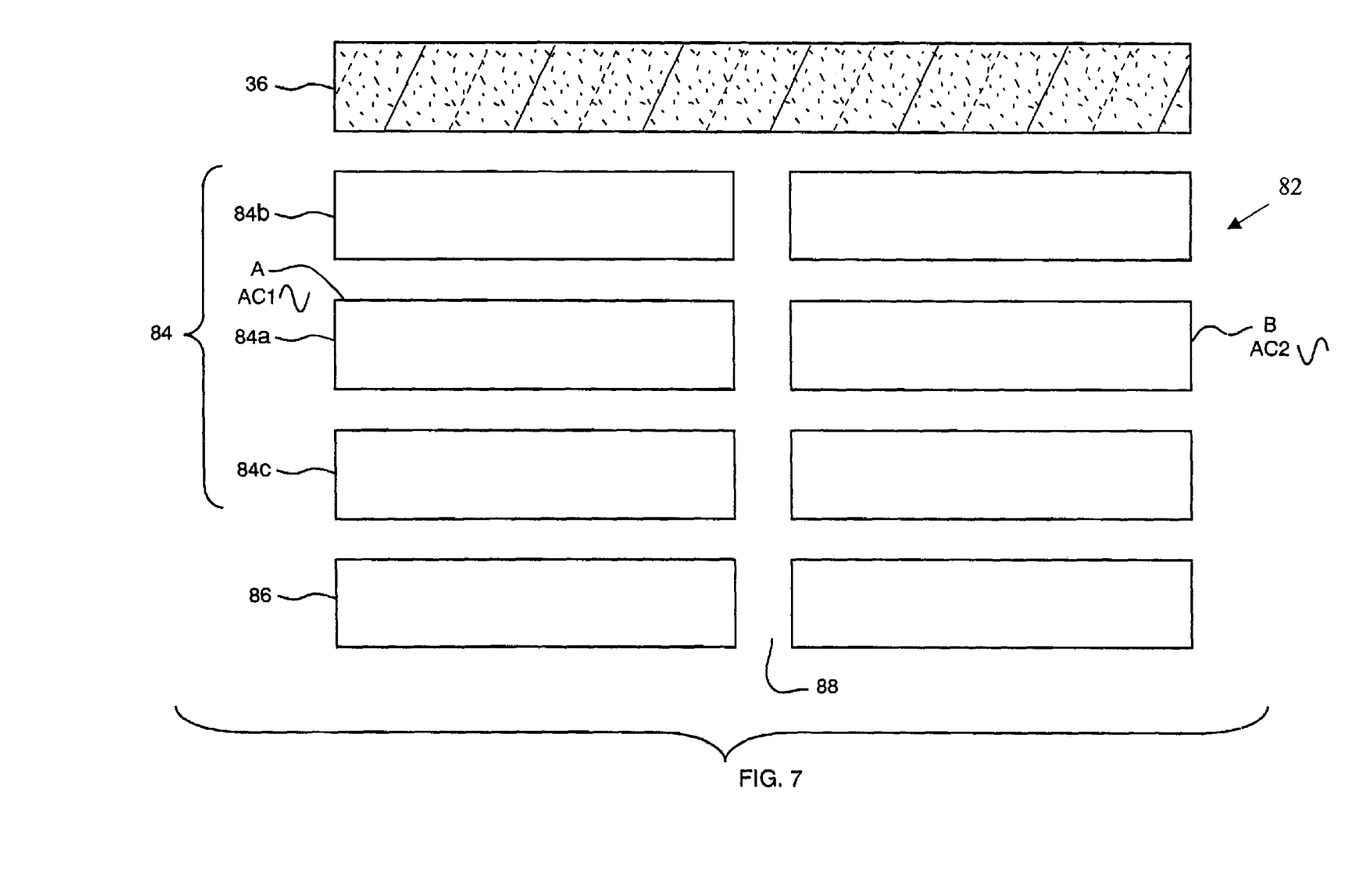

For example, FIG. 7 depicts another cooling device 82 that utilizes an electrostatic chuck 84 to hold a conductive wafer 36, such as, a silicon wafer, against a surface of a cooled platen 86. The chuck 84 includes an electrode 84a formed of two or more electrically insulated sections, such as, sections A and B, that are sandwiched between two dielectric layers 84b and 84c. Each dielectric layer 84b/84c has sections similar to those of electrode 84a. DC voltages of opposite polarity, or low frequency AC voltages having a selected phase shift relative to one another, such as, exemplary voltages AC1 and AC2, are applied to the sections A and B of the electrode 84a for clamping the wafer. Phase shifts between the AC voltages applied to different sections of the electrode 84a are adjusted such that an electrostatic force clamping the wafer 36 to the platen 86 can be maintained under conditions of overall neutrality of electric charge on the wafer. This causes application of an electrostatic force on the wafer to hold it against the platen 86. Further, a passageway 88 allows the introduction of a gas into a space between the wafer and the dielectric layer 84b to facilitate transfer of heat from the wafer to the cooled platen. Further details regarding mechanisms for cooling a wafer can be found in U.S. Pat. Nos. 5,244,820 and 5,822,172, both of which are herein incorporated by reference. In addition, further details regarding an electrostatic chuck can be found in U.S. Pat. No. 6,141,203, which is also herein incorporated by reference.

Commercially available ion implanters, suitable for use in the chamber 34, that can provide active gas cooling of a substrate is manufactured by Varian Semiconductor Equipment Associates of Gloucester, Mass., under the trade designations EHPi-500 and ViiSta 810 or by Axcelis Technologies of Beverly, Mass. under trade designations 8250HT, MC2, MC3, GSG-LE or by Applied Materials of Santa Clara, Calif. under trade designations 9500 and XR120. Those skilled in the art will appreciate that other ion implanters can also be utilized in the chamber 34 for performing the touch-up implant so long as they are equipped with a device for actively cooling the substrate and they can generate oxygen ions with requisite energies.

In the cooling devices described above, a gas, such as, helium, is utilized to facilitate transfer of heat from a semiconductor substrate to a heat sink, such as, a cooled platen. In an alternative conductive cooling technique, a thin layer of an elastomer, disposed between the substrate and a heat sink, such as, a cooled platen, facilitates transfer of heat from the substrate to the heat sink. Suitable elastomers can include silicone based resins, for example, RTV silicone compounds. An elastomer utilized for cooling a wafer can advantageously conform to the microscopic structure of the backside of the wafer, i.e., the side pressed against a cooled platen, thereby increasing the contact area between the wafer and the cooled platen. This can in turn enhance the cooling efficiency of the wafer. Further details regarding conductive cooling of a substrate during ion implantation can be obtained by reference to chapter 10 of "Ion implantation: Science and Technology", edited by J. F. Ziegler, published in 1996, and herein incorporated by reference.

A common practice for ion implantation is to mount a batch of wafers, typically 13, onto a rapidly spinning disk or wheel. The spin rate is typically about 900 to 1200 revolutions per minute (RPM), and the diameter of the wheel is typically four feet or greater. The resulting centripetal acceleration from this configuration is extremely large. A pedestal upon which each wafer rests is typically angled slightly toward the center of the wheel (7 to 10 degrees, typically) to generate a component of the centripetal acceleration for causing the wafer to be pressed against the pedestal. For example, a wafer with a mass of 28 grams (g) can experience a total centripetal force of approximately 250 N. to be pressed against the pedestal with a force of 40 N. When an elastomer is utilized for cooling the wafer, as described above, this force couples the wafer tightly to the elastomer, and hence results in very efficient heat flow (typically 0.5 W/° C. cm$^2$) from the wafer to the cooled pedestal.

Referring again to the flow chart 10 of FIG. 1, subsequent to the touch-up implant step 14, the substrate is annealed, in step 16, at an elevated temperature, for example, at a temperature in a range of about 800° C. to about 1400° C., while exposing it to an oxygen-containing atmosphere. As shown in FIG. 3, in this exemplary embodiment, the substrate is transferred from the chamber in which the touch-up implant is performed to another chamber, e.g., a chamber 90 of the system 24, in which the annealing step is performed. The oxygen concentration in the annealing chamber can be, for example, at least about 1% and preferably, in a range of about 1% to about 100%. More preferably, the oxygen concentration in the annealing chamber is in a range of about 20% to about 70%. A variety of atomic/molecular species can be utilized to generate the requisite oxygen concentration in the annealing chamber. For example, molecular oxygen ($O_2$), ozone ($O_3$), or water can be employed as a source of oxygen. Further, the annealing of the substrate can be performed over a period in a range of a few hours, for example, in a range of about 3 to 20 hours.

The exemplary chamber 90 includes a wafer holder 92 that holds the substrate 36 in the chamber. Further, the chamber 90 includes a heating device 94, that maintains the substrate temperature in a range of about 800° C. to slightly below the melting temperature of the substrate during the annealing step.

The annealing step is understood to redistribute the implanted oxygen ions and chemically bond them to silicon to form a continuous buried layer of silicon dioxide ($SiO_2$), i.e., BOX region, thereby separating an upper silicon layer, on the surface of which semiconductor devices can be formed, from the bulk silicon. This continuous buried oxide layer can have a thickness of a few hundred nanometers, for example, in a range of about 20 nm to about 500 nm.

As discussed above, the present invention teaches, inter alia, active cooling of the substrate during the touch-up implant which can advantageously lead to more efficient formation of the buried oxide layer with a higher thickness and better uniformity. As discussed above, in general, a touch-up implant step advantageously enhances the efficiency of the formation of the buried oxide layer during subsequent annealing step performed in an oxidizing atmosphere. Without being limited to a particular theory, the touch up implant is understood to damage a semiconductor layer in the vicinity of a previously formed damaged precursor layer, i.e., the precursor layer formed during the initial ion implantations step, thereby allowing oxygen in subsequent annealing step to diffuse through the surface layer and react more readily with the initial precursor layer. This in turn can result in an increased efficiency of the post implant oxidizing anneal, thereby generating a BOX region with an increased thickness.

Applicants have discovered that actively cooling the substrate during the touch-up implant to a temperature in a range of about 50° C. to 150° C. can further enhance the efficacy of this implantation step. In particular, in the absence of active cooling, the substrate temperature can vary widely during the touch-up implant, and can increase, for example, as a result of ion bombardment, to a value that is sufficiently high to cause a certain degree of self-annealing of the implant damage. In fact, calculations performed by Applicants, based on beam power and physical properties of silicon, indicate that the temperature of a silicon substrate during a touch-up implant, performed nominally at room temperature, e.g., 20° C., can rise to about 250–270° C. as a result of ion bombardment. Such elevated temperatures can cause some self-annealing of the substrate that runs counter to the purposes of performing the touch-up implant.

In contrast, actively cooling the substrate during the touch-up implant in accordance with the teachings of the invention can stabilize the substrate temperature in a defined range, e.g., 50 to 150° C. Maintaining the substrate temperature in a range of about 50° C. to 150° C. during the touch-up implant is particularly advantageous because at temperatures substantially higher than 150° C., some self-annealing of the substrate can occur, thereby reducing the efficacy of the touch-up implant. Further, at temperatures that are substantially below 50° C., the damage by the implanted ions to the upper silicon layer can be too extensive to be effectively ameliorated by a subsequent high temperature annealing step. Thus, actively cooling the substrate during the touch-up implant to a temperature in a range of about 50° C. to 150° C. results in enhanced efficiency of the damage accumulation and the damage morphology, which can significantly modify the kinetics of BOX formation to enhance the creation of the buried oxide layer during a subsequent oxidizing anneal.

In addition, actively cooling during the touch-up implant can result in better temperature uniformity of the substrate, thereby increasing the uniformity of the buried oxide layer formed during the subsequent annealing step.

Figure 8:
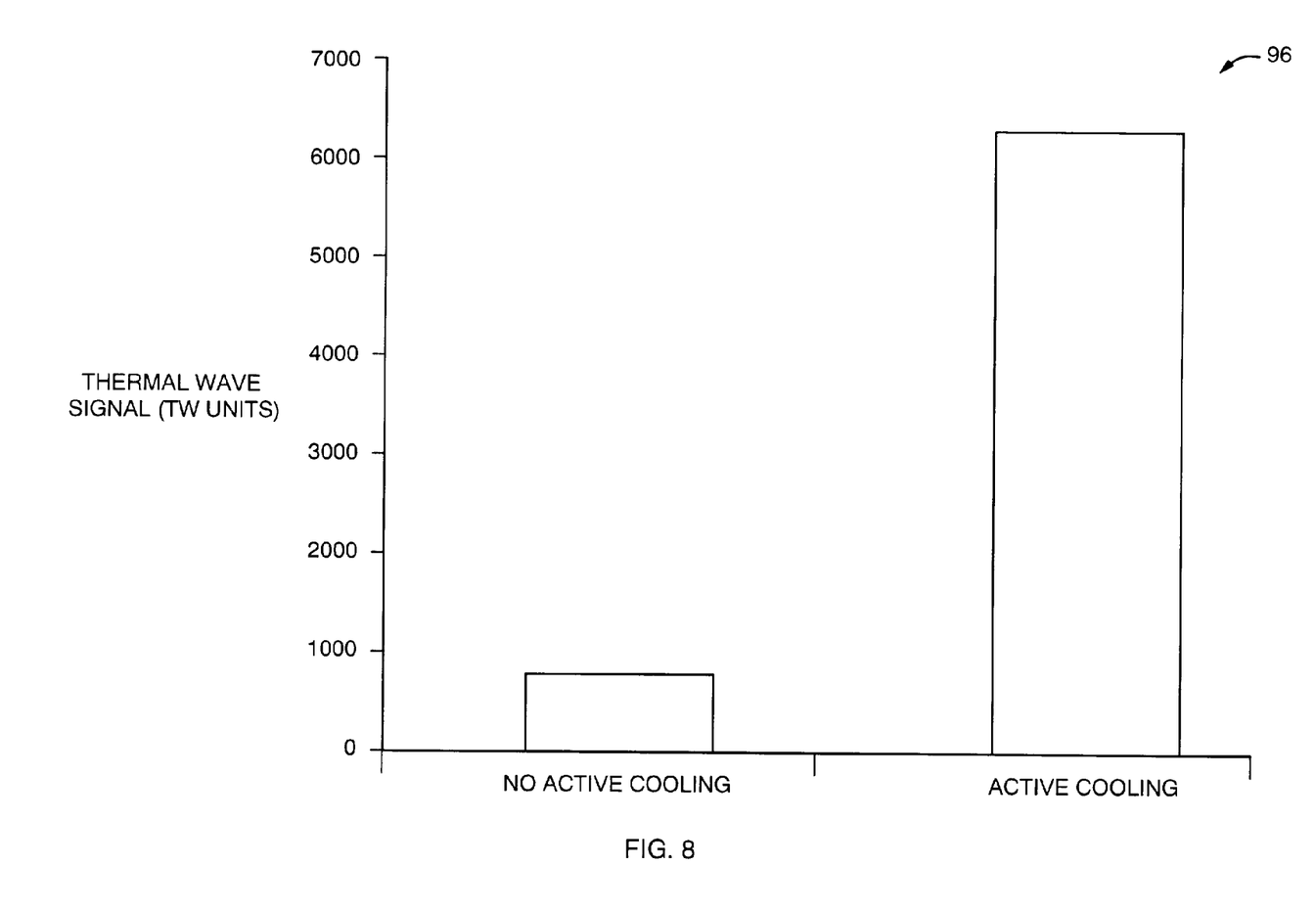
FIG. 8 is a bar graph presenting a comparison between the damage caused to an actively cooled substrate during a touch-up implant with the damage caused to a similar substrate that is not actively cooled.

To further illustrate the advantages of actively cooling the substrate during the touch-up implant in accordance with the teachings of the invention, FIG. 8 presents experimental data, in the form of a bar graph 96, illustrating that the damage caused in an actively cooled silicon substrate by a touch-up implant step for a given dose of oxygen is significantly higher than the damage caused by the same implantation dose in a silicon substrate that is not actively cooled.

In particular, the thermal conductivity measurements illustrated in FIG. 8, which correlate with the degree of damage caused in the substrate by ion bombardment during the touch-up implant, indicate a thermal wave signal of 6300 units for an actively cooled silicon substrate in which a dose of approximately $2 \times 10^{15}$ cm$^{-2}$ oxygen ions is implanted. In contrast, the bar graph 96 shows a thermal wave signal of approximately 800 units for a similar silicon substrate, that is not actively cooled, in which the same dose of oxygen ions is implanted during the touch-up implant. That is, this data illustrates that actively cooling the substrate in accordance with the teachings of the invention during the touch-up implant can enhance the degree of damage caused to the substrate by approximately an order of magnitude.

Figure 9:
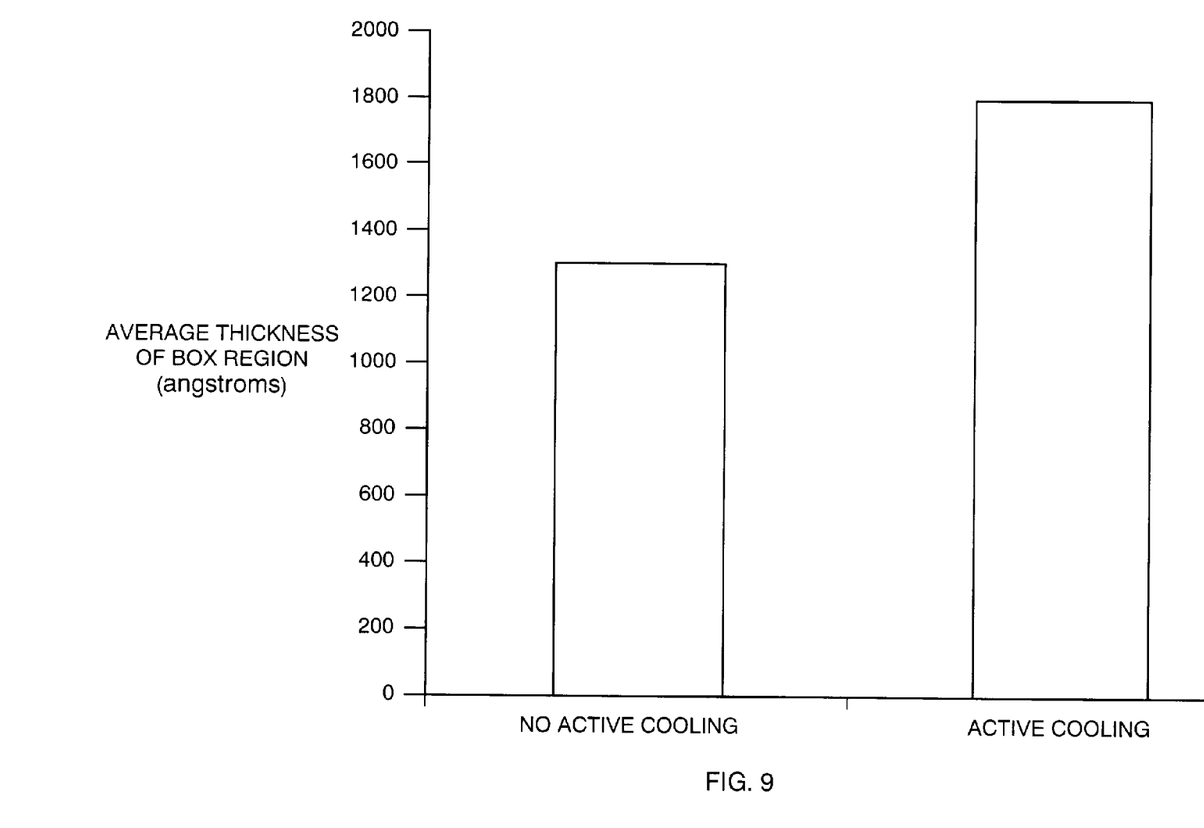
FIG. 9 is a bar graph presenting a comparison of the thickness of a buried oxide layer formed in a silicon wafer in accord with the teachings of the invention, in which active cooling is utilized during touch-up implant, with the thickness of a buried oxide layer formed without utilizing active cooling during the touch-up implant.

Further, actively cooling the substrate during the touch-up implant can result, for a given dose of implanted oxygen ions during the touch-up implant, in a larger thickness of the BOX region formed in a subsequent oxidizing anneal step. For example, FIG. 9 presents measurements of the average thickness of the BOX regions formed in two silicon wafers through an initial oxygen implantation step followed by a touch-up implant with an oxygen dose of approximately $2 \times 10^{15}$ ions/cm$^2$. Subsequent to the touch-up implant, the wafers were subjected to an oxidizing anneal step in accordance with the teachings of the invention to form the BOX regions.

One wafer was actively cooled during the touch-up implant to a temperature in a range of about 50 to 150° C. while no active cooling was provided for the other wafer. These BOX thickness measurements, performed by utilizing spectroscopic ellipsometry in a manner known in the art, indicate that the thickness of the BOX region formed in the actively cooled wafer is approximately 1800 Angstroms whereas the thickness of the BOX region formed in the other wafer is approximately 1300 Angstrom. That is, in this example, active cooling of the substrate during the touch up implant has resulted in approximately 30% increase in the thickness of the BOX region.

Those skilled in the art will appreciate that various modifications can be made to the above-described embodiments without departing from the scope of the invention. For example, a variety of ion implanters having devices for actively heating or cooling the substrate can be employed in a system according to the invention.

What is claimed is:

1. A method for forming a buried oxide layer in a semiconductor substrate, comprising:
    implanting a first dose of oxygen ions in the substrate in a first chamber while maintaining the substrate temperature in a range of about 300° C. to about 600° C.,
    implanting a second dose of oxygen ions in the substrate while actively cooling the substrate to maintain the substrate temperature in a range of approximately 50° C. to approximately 150° C. during implantation of said second dose, and
    annealing the substrate in an oxygen containing atmosphere to generate a buried oxide layer.

2. The method of claim 1, wherein the annealing step further comprises maintaining the substrate temperature in a range of about 800° C. to about 1400° C.

3. The method of claim 1, wherein the step of implanting a first dose further comprises implanting the oxygen ions in the substrate in a first chamber having a device for heating the substrate.

4. The method of claim 3, wherein the step of implanting a second dose further comprises implanting the oxygen ions in the substrate in a second chamber having a device for actively cooling the substrate.

5. The method of claim 4, wherein the step of annealing the substrate further comprises annealing the substrate in a third chamber.

6. The method of claim 1, wherein the first dose of implanted oxygen ions is selected to be about $10^{16}$ to $10^{18}$ cm$^{-2}$.

7. The method of claim 1, wherein the second dose of implanted oxygen ions is selected to be approximately $10^{13}$ to $5 \times 10^{15}$ cm$^{-2}$.

8. The method of claim 1, wherein the step of implanting a first dose of oxygen ions further comprises bombarding the substrate with oxygen ions having an energy in a range of about 30 keV to about 500 keV.

9. The method of claim 1, wherein the step of implanting a second dose of oxygen ions further comprises conductively cooling the substrate to maintain its temperature in said range of about 50° C. to about 150° C.

10. The method of claim 9, wherein the step of conductively cooling the substrate further comprises gas cooling the substrate.

11. The method of claim 9, wherein the step of conductively cooling the substrate further comprises utilizing an elastomer to form a conductive thermal path between the substrate and a heat sink.

12. The method of claim 11, further comprising selecting the elastomer to be a silicone resin.

13. The method of claim 1, further comprising selecting the substrate to be any of silicon (Si), germanium (Ge), Si/Ge alloys.

14. The method of claim 1, further comprising selecting the substrate to be any of a 4-4, 3-5, or 2-6 binary or ternary compound.

15. The method of claim 1, wherein the buried oxide layer has a thickness in a range of about 20 nm to about 500 nm.

16. A method for forming a buried oxide layer in a semiconductor substrate, comprising:
    implanting a first dose of oxygen ions in the substrate in a first chamber while maintaining the substrate temperature in a range of about 300° C. to about 600° C.,
    implanting a second dose of oxygen ions in the substrate while actively cooling the substrate to maintain the substrate temperature in a range of approximately 50° C. to approximately 150° C. during implantation of said second dose, and
    annealing the substrate in an oxygen containing atmosphere to generate a buried oxide layer,
    wherein the substrate is selected to be any of silicon (Si), germanium (Ge), or Si/Ge alloys and the annealing step further comprises annealing the substrate for a time period in a range of about 1 hour to about 30 hours.

17. The method of claim 16, wherein the annealing step is performed in an atmosphere having an oxygen concentration in a range of about 1% to 100%.

* * * * *